(12) United States Patent
Ban et al.

(10) Patent No.: US 10,818,797 B2
(45) Date of Patent: Oct. 27, 2020

(54) THIN FILM TRANSISTOR AND METHOD OF FABRICATING THE SAME, ARRAY SUBSTRATE AND DISPLAY DEVICE

(71) Applicant: BOE TECHNOLOGY GROUP CO., LTD., Beijing (CN)

(72) Inventors: Shengguang Ban, Beijing (CN); Zhanfeng Cao, Beijing (CN); Qi Yao, Beijing (CN); Dapeng Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/050,294

(22) Filed: Jul. 31, 2018

(65) Prior Publication Data

US 2019/0088788 A1 Mar. 21, 2019

(30) Foreign Application Priority Data

Sep. 20, 2017 (CN) .......................... 2017 1 0854906

(51) Int. Cl.
*H01L 29/786* (2006.01)
*H01L 29/417* (2006.01)
(Continued)

(52) U.S. Cl.
CPC .. *H01L 29/78618* (2013.01); *H01L 21/02675* (2013.01); *H01L 21/02678* (2013.01); *H01L 27/1285* (2013.01); *H01L 29/04* (2013.01); *H01L 29/165* (2013.01); *H01L 29/41733* (2013.01); *H01L 29/42384* (2013.01); *H01L 29/458* (2013.01); *H01L 29/66757* (2013.01);
(Continued)

(58) Field of Classification Search
CPC ......... H01L 29/78675; H01L 29/66757; H01L 27/1274; H01L 27/1285; H01L 27/1288; H01L 29/78609; H01L 29/786–78696; H01L 21/02675–02686; H01L 29/165; H01L 27/12–13
See application file for complete search history.

(56) References Cited

U.S. PATENT DOCUMENTS

| 9,887,087 B1* | 2/2018 | Fuller | ................... H01L 21/261 |
| 2003/0113957 A1* | 6/2003 | So | ..................... H01L 21/02422 |
| | | | 438/149 |

(Continued)

FOREIGN PATENT DOCUMENTS

| CN | 1725510 A | 1/2006 |
| WO | 2016170571 A1 | 10/2016 |

OTHER PUBLICATIONS

First Office Action dated Aug. 5, 2019 corresponding to Chinese application No. 201710854906.3.

*Primary Examiner* — Kevin Parendo
(74) *Attorney, Agent, or Firm* — Nath, Goldberg & Meyer; Joshua B. Goldberg; Stephanie F. Majkut

(57) ABSTRACT

The present application provides a thin film transistor and a method of fabricating the same, an array substrate and a display device. The thin film transistor includes: a gate electrode; an active layer including a first portion made of polysilicon and a second portion made of amorphous silicon; a source electrode and a drain electrode; and an ohmic contact layer. The second portion of the active layer is in contact with the source electrode and the drain electrode through the ohmic contact layer.

13 Claims, 9 Drawing Sheets

(51) Int. Cl.
*H01L 27/12* (2006.01)
*H01L 29/45* (2006.01)
*H01L 29/66* (2006.01)
*H01L 29/423* (2006.01)
*H01L 29/165* (2006.01)
*H01L 29/04* (2006.01)
*H01L 21/02* (2006.01)

(52) U.S. Cl.
CPC .. *H01L 29/78609* (2013.01); *H01L 29/78621* (2013.01)

(56) References Cited

U.S. PATENT DOCUMENTS

| | | | | |
|---|---|---|---|---|
| 2005/0139923 | A1* | 6/2005 | Kwon | H01L 27/1285 257/347 |
| 2007/0284580 | A1* | 12/2007 | Lim | H01L 29/66765 257/66 |
| 2012/0220140 | A1* | 8/2012 | Kajiyama | H01L 21/02532 438/795 |
| 2016/0293770 | A1* | 10/2016 | Peng | H01L 29/78621 |
| 2019/0198594 | A1* | 6/2019 | Lee | H01L 29/78666 |

* cited by examiner

THIN FILM TRANSISTOR AND METHOD OF FABRICATING THE SAME, ARRAY SUBSTRATE AND DISPLAY DEVICE

CROSS-REFERENCE TO RELATED APPLICATION

This application claims priority to Chinese Patent Application No. 201710854906.3, filed on Sep. 20, 2017, the contents of which are incorporated herein by reference in the entirety.

TECHNICAL FIELD

The present application relates to the field of display technology, and particularly to a thin film transistor and a method of fabricating the same, an array substrate and a display device.

BACKGROUND

With the increasing demand for high resolution, narrow bezel and low power consumption, low-temperature polysilicon (LTPS) becomes new material for the active layer of thin film transistors in flat panel display devices due to its higher carrier mobility than conventional amorphous silicon materials. Accordingly, LTPS backplane technique results in high aperture ratio of display screen and contributes to the implementation of gate on array (GOA), so LTPS-based display panels have a better display effect as compared to the amorphous silicon-based display panels.

SUMMARY

The present disclosure provides a thin film transistor and a method of fabricating the same, an array substrate and a display device.

In an aspect, the present disclosure provides a thin film transistor, which includes: an active layer including a first portion made of polysilicon and a second portion made of amorphous silicon; a source electrode and a drain electrode; and an ohmic contact layer. The second portion of the active layer is in contact with the ohmic contact layer, and the source electrode and the drain electrode are in contact with the ohmic contact layer.

In some embodiments, the ohmic contact layer includes polysilicon and an impurity for providing carriers.

In some embodiments, the second portion of the active layer at least partially surrounds the first portion.

In some embodiments, the ohmic contact layer and the active layer are disposed in a same layer, and the ohmic contact layer is at two opposite sides of the active layer.

In some embodiments, the thin film transistor further includes a gate electrode, and a gate insulating layer. The ohmic contact layer and the active layer are on a substrate, the gate insulating layer is at a side of the ohmic contact layer and the active layer facing away from the substrate, and the gate electrode is at a side of the gate insulating layer facing away from the ohmic contact layer and the active layer. The source electrode and the drain electrode are at a side of the ohmic contact layer facing away from the substrate, and are in contact with and electrically connected to the ohmic contact layer by passing through the gate insulating layer.

In some embodiments, the thin film transistor further includes a buffer layer on the substrate, and the ohmic contact layer and the active layer are at a side of the buffer layer facing away from the substrate.

In some embodiments, the active layer is on a substrate, and the ohmic contact layer is at a side of the second portion of the active layer facing away from the substrate and in contact with the second portion of the active layer.

In some embodiments, an orthographic projection of the gate electrode on the substrate substantially covers orthographic projections of the first portion and the second portion of the active layer on the substrate.

In some embodiments, the orthographic projection of the gate electrode on the substrate is substantially non-overlapping with an orthographic projection of the ohmic contact layer on the substrate.

In another aspect, the present disclosure provides a method of fabricating a thin film transistor, which includes: forming an active layer, the active layer being formed to include a first portion made of polysilicon and a second portion made of amorphous silicon; forming an ohmic contact layer; and forming a source electrode and a drain electrode. The active layer, the ohmic contact layer, the source electrode and the drain electrode are formed such that the second portion of the active layer is in contact with the ohmic contact layer and the source electrode and the drain electrode are in contact with the ohmic contact layer.

In some embodiments, the step of forming the active layer includes: forming an amorphous silicon layer; and performing a partial crystallization process on the amorphous silicon layer to form a polysilicon pattern and an amorphous silicon pattern, the polysilicon pattern including the first portion of the active layer and the amorphous silicon pattern including the second portion of the active layer.

In some embodiments, the polysilicon pattern includes a first sub-portion and at least two second sub-portions, the second portion of the active layer being interposed between the first sub-portion and the second sub-portions, and the first sub-portion being the first portion of the active layer.

In some embodiments, the ohmic contact layer is formed by a step of performing a doping process on the second sub-portions of the polysilicon pattern.

In some embodiments, the step of performing a doping process on the second sub-portions of the polysilicon pattern includes: forming an interlayer dielectric layer; forming vias in the interlayer dielectric layer to expose the second sub-portions of the polysilicon pattern, respectively; and doping the second sub-portions of the polysilicon pattern through the vias to form the ohmic contact layer.

In some embodiments, the step of performing the partial crystallization process on the amorphous silicon layer includes: performing the partial crystallization process on the amorphous silicon layer by using a laser crystallization technique with a mask.

In some embodiments, the partial crystallization process is perforated on the amorphous silicon layer by using an excimer laser annealing apparatus with a mask, the excimer laser annealing apparatus including a plurality of groups of micro-lenses.

In some embodiments, the mask is formed of a material not absorbing laser energy, the material not absorbing laser energy including cadmium.

In another aspect, the present disclosure provides an array substrate including the above thin film transistor.

In another aspect, the present disclosure provides a display device including the above array substrate.

DETAILED DESCRIPTION

Figure 1:
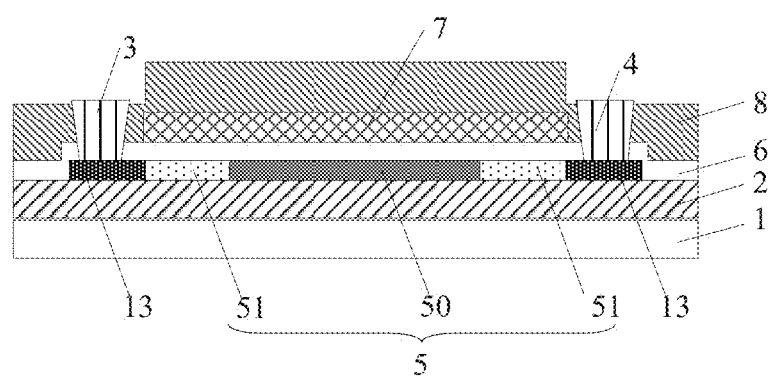
FIG. 1 is a cross-sectional view illustrating a structure of a thin film transistor according to an embodiment of the present disclosure.

To make those skilled in the art better understand the technical solutions of the present disclosure, the present disclosure will be further described in detail below in conjunction with the accompanying drawings and specific embodiments.

In the present disclosure, a photolithography process refers to a process for forming a pattern by using photoresist, masks, an exposure machine, and the like, including processes of exposure, development, etching and the like; a patterning process is a process for forming a predetermined pattern, which includes a photolithography process, and also includes other processes for forming a predetermined pattern, such as printing, inkjet, and the like.

In the present disclosure, "disposed in a same layer" refers to the relationship between the layers simultaneously formed in the same step, and does not always mean that the thickness of the layer or the height of the layer in a cross-sectional view is the same.

The present disclosure provides a thin film transistor and a method of fabricating the same, which can at least solve the problem that a lightly doped drain (LDD) process is required in existing methods of fabricating a LTPS thin film transistor and thus the fabrication process is complicated. By having the thin film transistor and the method of fabricating the same provided by the present disclosure, a leakage current of the thin film transistor can be reduced, and the LDD process can be omitted, thereby reducing the manufacturing cost and increasing the productivity. The thin film transistor includes a gate electrode, an active layer, a source electrode and a drain electrode. The active layer includes a first portion made of polysilicon and second portions made of amorphous silicon, and the second portions made of amorphous silicon in the active layer are in contact with the source electrode and the drain electrode, respectively, through an ohmic contact layer. The second portions made of amorphous silicon in the active layer increase resistances between the active layer and the source and drain electrodes to reduce the leakage current of the thin film transistor. In the present application, the portions made of amorphous silicon in the active layer being in contact with the ohmic contact layer may refer to that the portions are in direct contact with the ohmic contact layer, for example, as illustrated in the drawings.

Accordingly, the method of fabricating the thin film transistor according to an embodiment of the present disclosure includes steps of forming a gate electrode, an active layer, a source electrode and a drain electrode. The active layer includes a first portion made of polysilicon and second portions made of amorphous silicon, and the second portions made of amorphous silicon in the active layer are in contact with the source and drain electrodes, respectively, through an ohmic contact layer. The second portions made of amorphous silicon in the active layer increase resistances between the active layer and the source and drain electrodes to reduce the leakage current of the thin film transistor.

Herein, the ohmic contact layer refers to a contact structure between a semiconductor material provided as an active layer and a metal material provided as a source electrode and a drain electrode, in which contact surfaces formed by the active layer and the source and drain electrodes each has a resistance value much smaller than that of the semiconductor material itself, such that the voltage drop in the thin film transistor when being turned on mainly occurs in the active region and not at the contact surfaces. In the present disclosure, the ohmic contact layer includes polysilicon and an impurity for providing carriers, and the ohmic contact layer may be a polysilicon layer or ohmic contact layer formed by a heavy doping process.

By having the thin film transistor and the method of fabricating the same provided by the present disclosure, a crystallization process is changed and the LDD process is omitted, thereby reducing the manufacturing cost and increasing the productivity.

In an aspect, embodiments of the present disclosure provide a thin film transistor and a method of fabricating the same, which can significantly reduce the leakage current of the thin film transistor and omit the LDD process in the fabrication process.

As illustrated in FIG 1, the thin film transistor includes: a substrate 1; a buffer layer 2 on the substrate 1; an ohmic contact layer 13 and an active layer 5 at a side of the buffer layer 2 facing away from the substrate 1; a gate insulating layer 6 at a side of the ohmic contact layer 13 and the active layer 5 facing away from the buffer layer 2; a gate electrode 7 at a side of the gate insulating layer 6 facing away from the ohmic contact layer 13 and the active layer 5; an interlayer dielectric layer 8 at a side of the gate electrode 7 and the gate insulating layer 6 facing away from the ohmic contact layer 13 and the active layer 5; and a source electrode 3 and a drain electrode 4 passing through the interlayer dielectric layer 8 and the gate insulating layer 6 to be in directly contact with and electrically connected to the ohmic contact layer 13. The active layer 5 includes a first portion 50 made of polysilicon, and second portions 51 at both sides of the first portion 50 and made of amorphous silicon. The ohmic contact layer 13 is disposed in a same layer as the active layer 5 and is in contact with the second portions 51 of the active layer 5. The gate electrode 7 is disposed on the active layer 5, and the source electrode 3 and the drain electrode 4 are disposed on the ohmic contact layer 13. With reference to FIG. 1, the orientation "on" is relative to the substrate 1 and used to describe layers of the thin film transistor that are supported by the substrate 1 and formed sequentially on the substrate 1. In some embodiments, an orthographic projection of the gate electrode 7 on the substrate 1 substantially covers an orthographic projection of the active layer 5 on the substrate 1. In some embodiments, the orthographic projection of the gate electrode 7 on the substrate 1 may not overlap with an orthographic projection of the ohmic contact layer 13 on the substrate 1.

It should be noted that the case where the ohmic contact layer 13 is disposed in a same layer as the active layer 5 as illustrated in FIG. 1 is not limited to a top gate type transistor. A bottom gate type transistor may also be provided with an active layer including a first portion and second portions as that in FIG. 1, and the active layer may also be disposed in a same layer as an ohmic contact layer in the bottom gate type transistor.

Accordingly, the present disclosure further provides a method of fabricating the thin film transistor, which includes steps of forming the gate electrode 7, the active layer 5, the source electrode 3 and the drain electrode 4. The ohmic contact layer 13 is disposed in a same layer as the active layer 5 and is in contact with the portions made of amorphous silicon in the active layer. The gate electrode 7 is disposed on the active layer 5. The source electrode 3 and the drain electrode 4 are disposed on the ohmic contact layer 13. A portion of the active layer 5 made of polysilicon is the first portion 50, and the portions of the active layer 5 made of amorphous silicon are the second portions 51.

The active layer 5 may be formed by a partial crystallization process, that is, a middle region of the active layer 5 is formed as the first portion 50 made of polysilicon to ensure a recombination probability of electrons and holes, while the remaining regions of the active layer 5 (i.e., regions at both sides of the first portion 50) are formed as the second portions 51 made of amorphous silicon to increase resistances between the active layer 5 and the source and drain electrodes 3 and 4 at both sides of the active layer 5, thereby reducing the leakage current of the thin film transistor.

Figure 2:
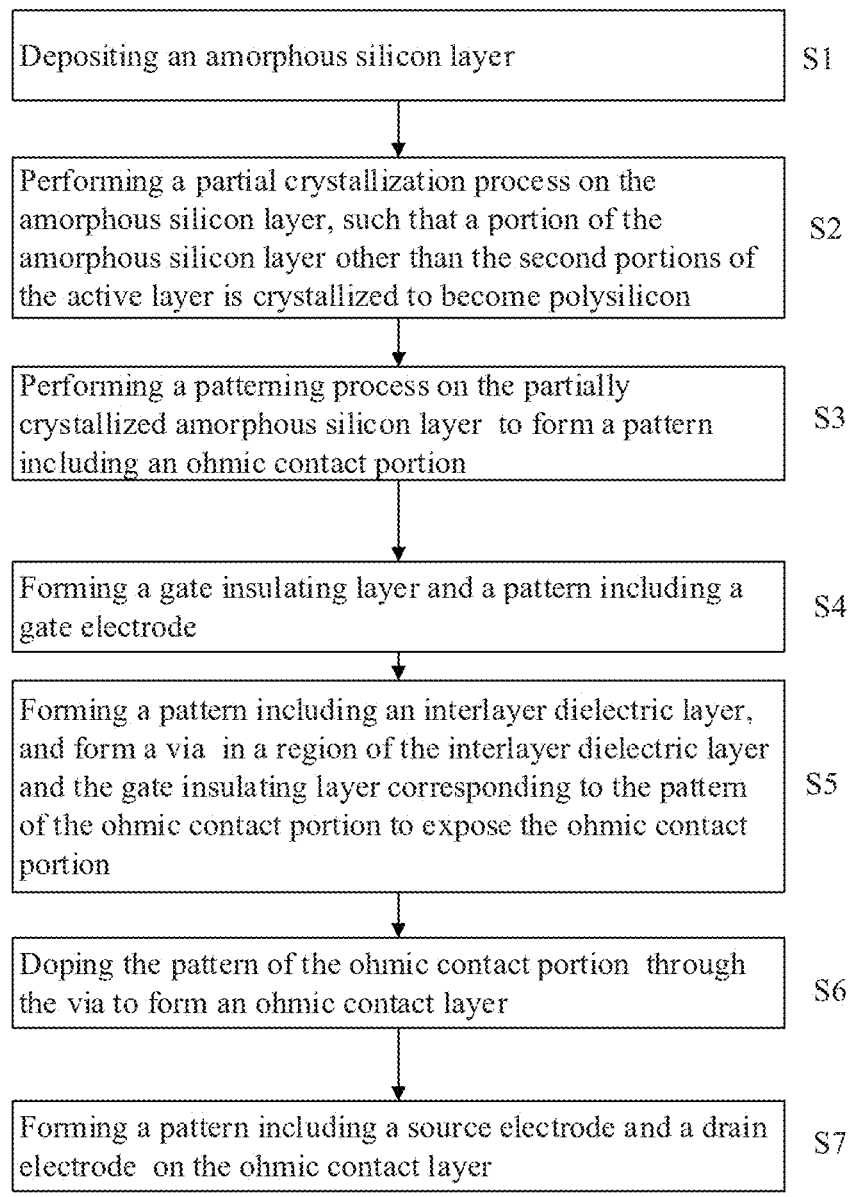
FIG. 2 is a flowchart of a method of fabricating a thin film transistor according to an embodiment of the present disclosure.

As illustrated in FIG. 2, the method of fabricating the thin film transistor includes steps S1 to S7.

At step S1, an amorphous silicon layer is deposited.

Figure 3A:
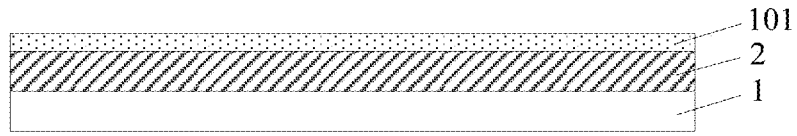
FIGS. 3A to 3I are cross-sectional views illustrating steps of the method of fabricating a thin film transistor according to an embodiment of the present disclosure.

In this step, a buffer layer 2 and an amorphous silicon layer 101 are formed on the substrate 1 sequentially by a plasma enhanced chemical vapor deposition (PECVD) method, as illustrated in FIG. 3A. Here, the buffer layer 2 may be of multiple layers, for example, formed as $SiN_x/SiO_2$ layers, in which a thickness of the $SiN_x$ layer is in the range of 500 Å to 1000 Å and a thickness of the $SiO_2$ layer is in the range of 1000 Å to 3000 Å.

At step S2, the amorphous silicon layer is subjected to a partial crystallization process, such that the amorphous silicon layer is crystallized into polysilicon in a region other than the second portions.

Figure 3B:
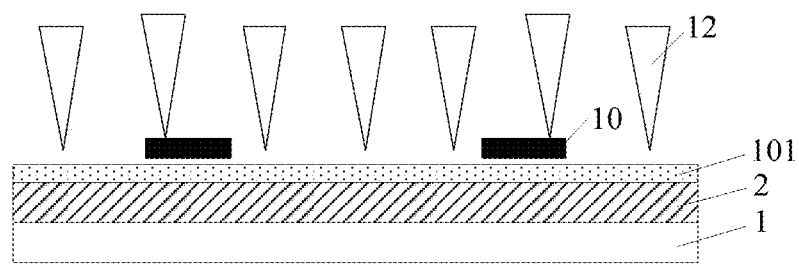
Figure 3C:
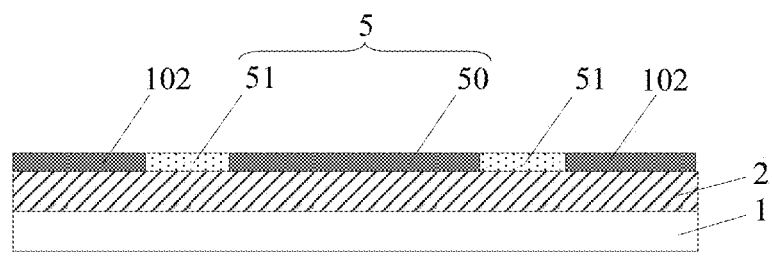

As illustrated shown in FIG. 3B, the amorphous silicon layer 101 is subjected to partial crystallization by, for example, a laser 12 using a mask 10, to form a pattern including the active layer 5 and a polysilicon layer 102 as illustrated in FIG. 3C. As illustrated in FIG. 3C, the active layer 5 is formed to include a first portion 50 and second portions 51, and the polysilicon layer 102 is at both sides of the active layer 5 and is in contact with the second portions 51. The second portions 51 correspond to the position of the mask 10 of FIG. 3B, for example, a combination of orthographic projections of the second portions 51 on the substrate 1 substantially overlaps with an orthographic projection of the mask 10 on the substrate 1 in FIG. 3B. The first portion 50 is a central portion of the active layer 5, in which the voltage drop of the thin film transistor when being turned on mainly occurs. The remaining regions (i.e., the second portions 51) of the active layer 5 other than the first portion 50 are shielded by the mask 10 during the partial crystallization process and thus the remaining regions still have the amorphous silicon from the amorphous silicon layer 101 remained therein. The second portions 51 made of amorphous silicon increase the resistances between the active layer and the source and drain electrodes. In this step, by using a partial crystallization process, the material properties of different regions in a same layer are changed, the LDD process is omitted, the manufacturing cost is reduced, and the productivity is increased.

Figure 3D:
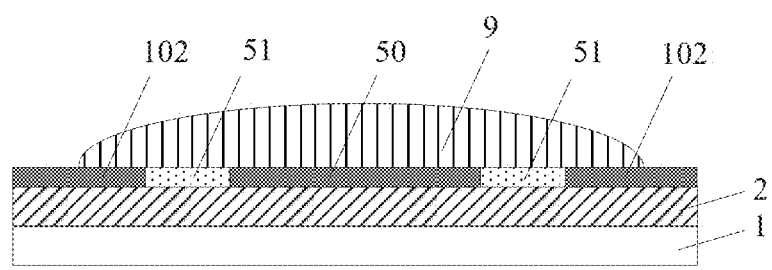
Figure 3E:
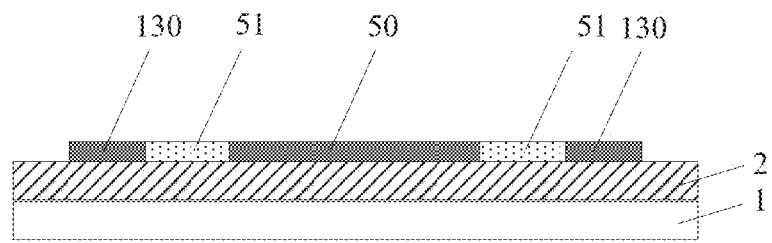

In a display region, the crystallization process is performed mainly on areas corresponding to the first portion 50 and ohmic contact portions 130 corresponding to the source and drain electrodes (the ohmic contact portions 130 are formed after the crystallization process and the patterning process, and correspond to the regions of the source electrode 3 and the drain electrode 4, which will be described later with reference to FIGS. 3E and 3I), as illustrated in FIG. 3B. After the crystallization, a pattern including the active layer 5 is formed, and the active layer 5 includes the first portion 50 and the second portions 51 (the first portion 50 and the second portions 51 are below the gate electrode 7 and thus do not need to be patterned). The ohmic contact portions can be formed by patterning the polysilicon layer 102 illustrated in FIG. 3C, and portions between the first portion 50 and the ohmic contact portions 130 are not subjected to the crystallization, have amorphous silicon remained therein and are formed as the second portions 51. These portions of amorphous silicon can effectively reduce the leakage current of the LTPS thin film transistor.

Figure 4A:
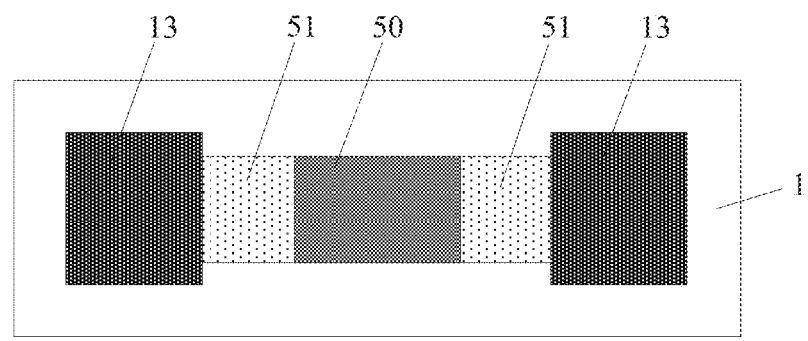
FIG. 4A is a top view illustrating a thin film transistor according to an embodiment of the present disclosure.
Figure 4B:
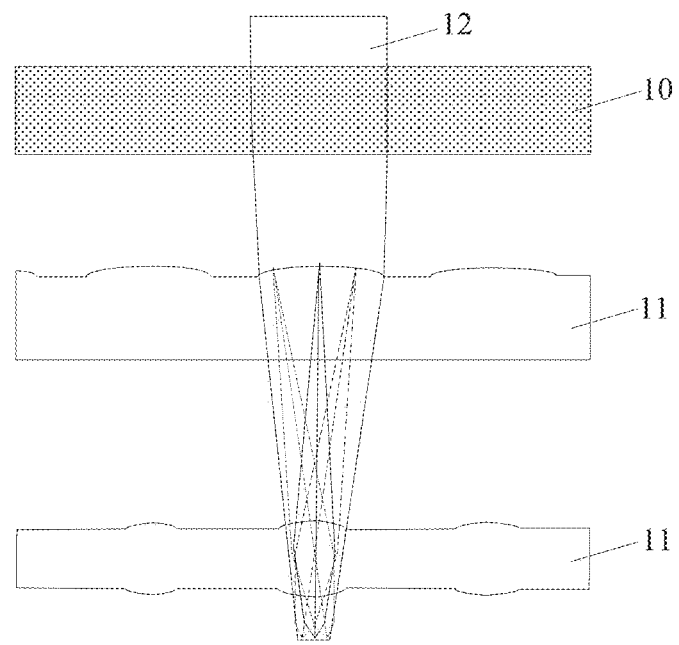
FIG. 4B is a schematic view illustrating laser annealing with multiple lenses according to an embodiment of the present disclosure.

In the fabrication process, the amorphous silicon layer 101 is partially crystallized by using a laser crystallization technique with the mask 10, so the amorphous silicon layer 101 is crystallized into polysilicon in an area corresponding to the first portion 50 and the region including the ohmic contact portions 130 (that is, the polysilicon layer 102 of FIG. 3C), while an area (that is, the second portions 51) where the amorphous silicon layer 101 is not subjected to the crystallization has amorphous silicon remained therein. Referring to FIG. 4B, the amorphous silicon layer 101 may be partially crystallized by using an excimer laser annealing apparatus with the mask 10. In the excimer laser annealing apparatus, multiple groups of micro lenses 11 are superimposed, and the laser 12 reaches a high energy density by multi-lens annealing (MLA). The portion irradiated with the light beam of the laser 12 is melted and recrystallized, so that the amorphous silicon in the region of the thin film transistor corresponding to the ohmic contact portions is selectively converted into polysilicon.

Since the temperature during the laser annealing is very high (about 1400° C.), in some embodiments, the mask 10 is made of a special material (for example, a material that does not absorb laser energy, such as cadmium) to satisfy such a high temperature requirement.

In the conventional method of fabricating a thin film transistor, after the deposition, photolithography and etching of a gate material layer and the patterning of the gate material layer to form a gate electrode, it is required to shield the channel region by the gate electrode and then perform a LDD process on regions other than the region shielded by the gate electrode, which not only complicates the process but also causes a problem that a length of a lightly doped drain region cannot be controlled precisely. In the method of fabricating a thin film transistor according to an embodiment of the present disclosure, it only needs to have the amorphous silicon remained in the second portions 51 without performing the crystallization thereon, thereby reducing the leakage current by using the amorphous silicon. Thus, the present method has the advantages of simple process and controllable length. In some embodiments, the spacing (i.e., the length of the second portion 51) between the first portion 50 and the ohmic contact portion 130 is from 0.2 micrometers to 2 micrometers.

At step S3, the partially crystallized amorphous silicon layer is formed to be a pattern including ohmic contact portions by a patterning process.

In this step, a patterning process being performed on the partially crystallized amorphous silicon layer mainly means that the polysilicon layer 102 at both sides of the active layer 5 is patterned by the patterning process to obtain a polysilicon pattern including a first sub-portion and second sub-portions, the first sub-portion of the polysilicon pattern being the first portion 50 of the active layer 5, and the second sub-portions of the polysilicon pattern being the ohmic contact portions 130 as illustrated in the drawings. Specifically, first, the substrate 1 including the partially-crystallized amorphous silicon layer is exposed by a photolithography process using a photoresist layer 9, the photoresist layer 9 covering the first portion 50, the second portions 51, and a portion of the polysilicon layer 102 where the ohmic contact portions 130 are to be formed, as illustrated in FIG. 3D. Then, the substrate 1 is etched and the photoresist layer 9 is removed to obtain the pattern including the ohmic contact portions 130 as illustrated in FIG. 3E. FIG. 4A illustrates a top view of the substrate including the first portion 50, the second portions 51, and the ohmic contact portions 130 obtained in this step, and the ohmic contact layer 13 in FIG. 4A corresponds to the ohmic contact portions 130 obtained in this step.

In the method of fabricating a thin film transistor according to an embodiment of the present disclosure, by using a laser annealing apparatus with a mask instead of the existing excimer laser annealing apparatus, the amorphous silicon layer is partially crystallized to form the first portion 50 and the ohmic contact portions 130 each made of polysilicon, and the second portions 51 (i.e., the regions that are not subjected to the crystallization) between the first portion 50 and the ohmic contact portions 130 have the original amorphous silicon remained therein. The amorphous silicon can effectively reduce the leakage current of the thin film transistor during the operation of the thin film transistor, thereby improving the display contrast of the display panel, and improving the final display effect. In addition, the method can also reduce the manufacturing cost and increase the productivity by omitting the LDD process in the existing LTPS backplane technique.

At step S4, a gate insulating layer and a pattern including a gate electrode are formed.

Figure 3F:
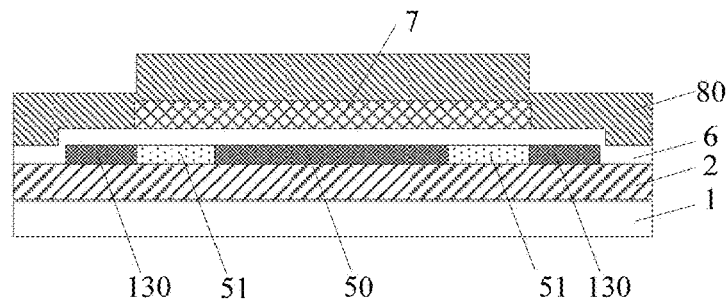

In this step, after the patterned ohmic contact portions 130 are obtained, by a patterning process, a gate insulating layer 6 and a gate film layer are subsequently deposited on the active layer 5 and the ohmic contact portions 130, and the gate film layer is patterned to obtain a pattern including a gate electrode 7 (the gate insulating layer 6 does not need to be patterned), as illustrated in FIG. 3F.

At step S5, a pattern including an interlayer dielectric layer is formed, and vias are formed in regions of the interlayer dielectric layer and the gate insulating layer corresponding to the pattern of the ohmic contact portions to expose the ohmic contact portions.

Figure 3G:
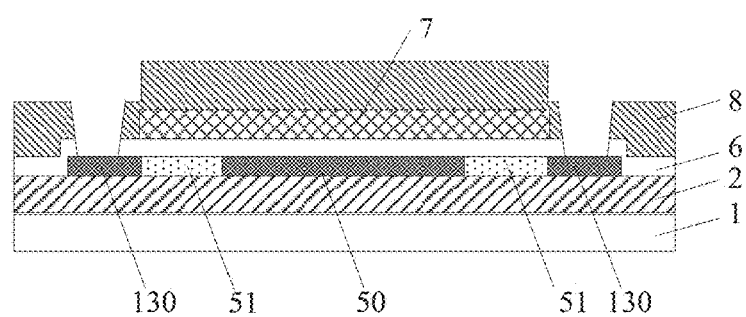

In this step, an interlayer dielectric film layer 80 is deposited after the patterning process for the gate electrode 7, an interlayer dielectric layer 8 is obtained by patterning the interlayer dielectric film layer 80, and the vias are formed in regions of the interlayer dielectric layer 8 and the gate insulating layer 6 corresponding to the pattern of the ohmic contact portions 130 to expose the ohmic contact portions 130, repsectively. The via portions in the interlayer dielectric layer 8 are used to define the source electrode and the drain electrode to be formed, as illustrated in FIG. 3G.

At step S6, the pattern of the ohmic contact portions is doped through the vias to form an ohmic contact layer.

Figure 3H:
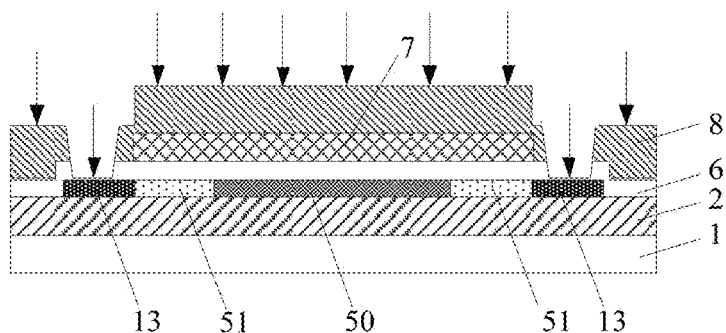

The ohmic contact layer is formed in two steps. First, the pattern of the ohmic contact portions is formed by a patterning process, and then the ohmic contact layer is formed by doping the pattern of the ohmic contact portions. In this step, as illustrated in FIG. 3H, the ohmic contact portions 130 are doped (the doped impurity is selected according to the type of the thin film transistor, e.g., doped with phosphorus ions) through the vias, to obtain the ohmic contact layer 13. Since the orthographic projection of the gate electrode 7 on the substrate 1 completely covers those of the first portion 50 and the second portions 51 on the substrate 1, the second portions 51 can be shielded by the gate electrode 7 from being doped.

It can be seen that the gate electrode 7 is used to shield the active layer 5 in the subsequent doping process, and the partial crystallization and a common doping process can be used together to simplify the process.

At step S7, a pattern including a source electrode and a drain electrode is formed on the ohmic contact layer.

Figure 3I:
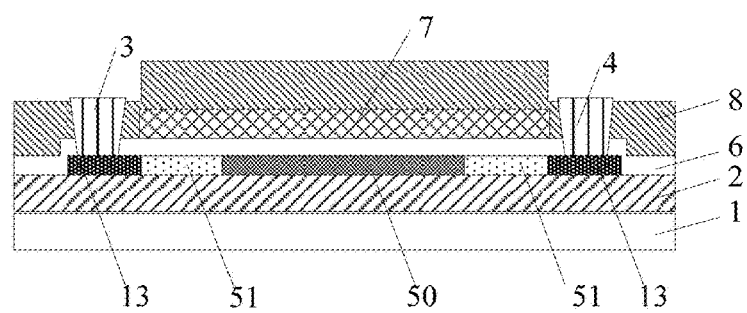

In this step, a pattern including the source electrode 3 and the drain electrode 4 is formed on the ohmic contact layer 13 in a region corresponding to the vias, and finally a thin film transistor as illustrated in FIG. 3I is obtained. In the thin film transistor, the leakage current can be reduced by the amorphous silicon of the second portion 51.

In the related art, a lightly doped drain region process is required in order to reduce the leakage current of the thin film transistor. Since the length of the lightly doped drain region is relatively difficult to control, and the doping amount of the lightly doped drain region also needs to be accurately controlled, the lightly doped drain region process is difficult and complicated. In the thin film transistor and the method of fabricating the same according to an embodiment of the present disclosure, a relatively low leakage current can be ensured without using a lightly doped drain region process, so a source electrode and a drain electrode can be doped without requiring the lightly doped drain region process, thereby effectively reducing the process difficulty.

In the thin film transistor and the method of fabricating the same according to an embodiment of the present disclosure, the amorphous silicon layer is partially crystallized by using a laser crystallization technique with a mask to obtain a first portion of the active layer made of polysilicon and ohmic contact portions made of polysilicon, while the uncrystallized regions between the first portion of the active layer and the ohmic contact portions still have amorphous silicon remained therein. These portions of the amorphous silicon layer keeps unetched, thereby omitting the lightly doped drain region process in the LTPS backplane fabrication, and the leakage current during the operation of the display panel can be reduced without the lightly doped drain region process. It can effectively reduce the difficulty in the fabrication, reduce the manufacturing cost, increase the productivity, and improve the characteristics of the product.

The thin film transistor and the method of fabricating the same according to the embodiments of the present disclosure are described above by taking a top gate type structure as an example with reference to FIGS. 1 to 4A. The inventive concept can also be applied to a bottom gate type LTPS structure, and in this case, the number of masks in the existing LTPS technology can be reduced from a range of 8 to 9 to a range of 4 to 6, thereby greatly reducing the production process and reducing the manufacturing cost.

Figure 5:
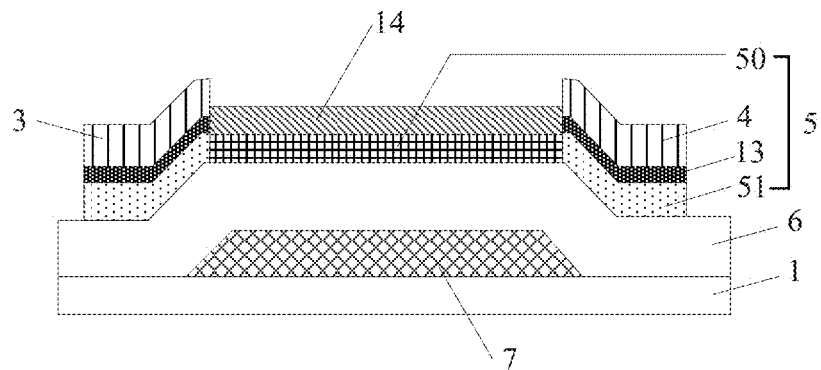
FIG. 5 is a cross-sectional view illustrating a structure of a thin film transistor according to an embodiment of the present disclosure.

To this end, the thin film transistor and the method of fabricating the same according to the embodiments of the present disclosure will be described hereinafter by taking a bottom gate type structure as an example. As illustrated in FIG. 5, the thin film transistor includes: a substrate 1; a gate electrode 7 on the substrate 1; a gate insulating layer 6 at a side of the gate electrode 7 facing away from the substrate 1; an active layer 5 at a side of the insulating layer 6 facing away from the gate electrode 7 and including a first portion 50 made of polysilicon and second portions 51 made of amorphous silicon at both sides of the first portion 50; an ohmic contact layer 13 at a side of the second portions 51 facing away from the gate insulating layer 6 (i.e., facing away from the substrate 1); and a source electrode 3 and a drain electrode 4 at a side of the ohmic contact layer 13 facing away from the second portions 51.

It should be noted that the case where the ohmic contact layer 5 is at a side of the second portions 51 of the active layer facing away from the substrate 1 as illustrated in FIG. 5 is not limited to the bottom gate type transistor. A top gate type transistor may also be provided with an active layer including a first portion and second portions as that in FIG. 5, and an ohmic contact layer of the top gate type transistor may be disposed at a side of the second portions facing away from a substrate, as that illustrated in FIG. 5.

Accordingly, embodiments of the present disclosure further provides a method of fabricating a thin film transistor, which includes steps of forming the gate electrode 7, the active layer 5, the source electrode 3, and the drain electrode 4. The ohmic contact layer 13 is on the second portions 51 of the active layer 5, which are made of amorphous silicon. The gate electrode 7 is disposed under the active layer 5, and the source electrode 3 and the drain electrode 4 are disposed on the ohmic contact layer 13.

Figure 6:
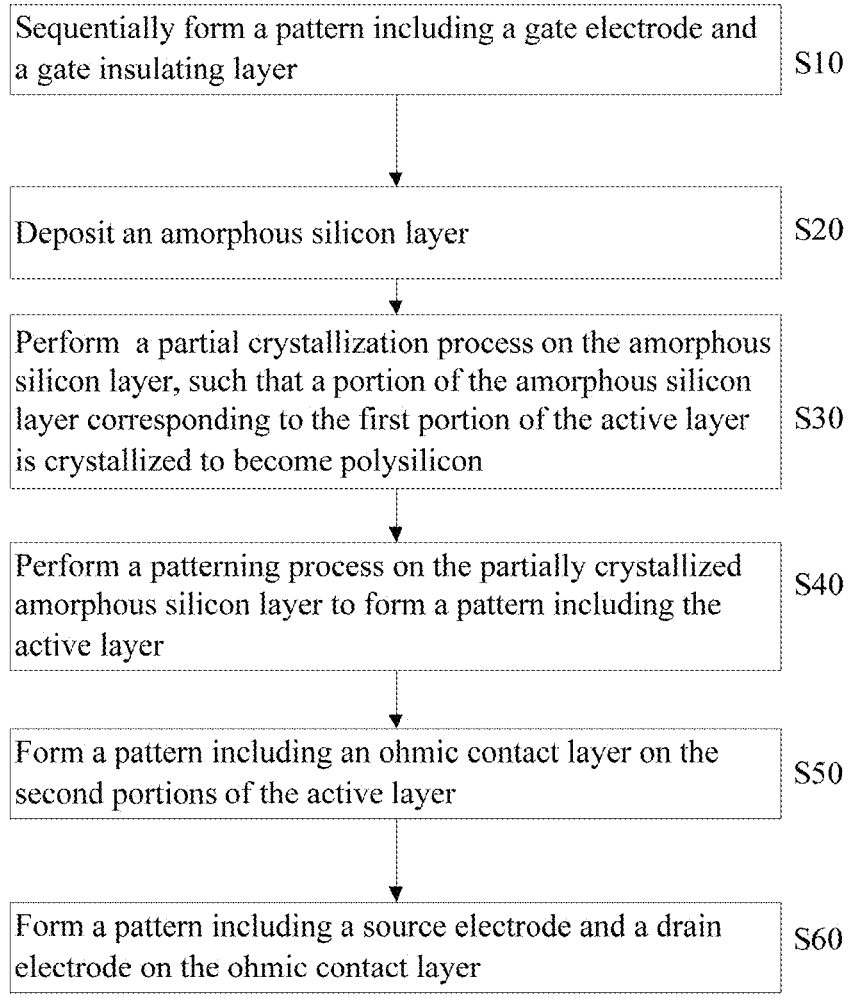
FIG. 6 is a flowchart of a method of fabricating a thin film transistor according to an embodiment of the present disclosure.

As illustrated in FIG. 6 the flowchart of the method of fabricating the thin film transistor, the method of fabricating the thin film transistor includes steps S10 to S60.

At step S10, a pattern including a gate electrode and a gate insulating layer are sequentially formed.

Figure 7A:
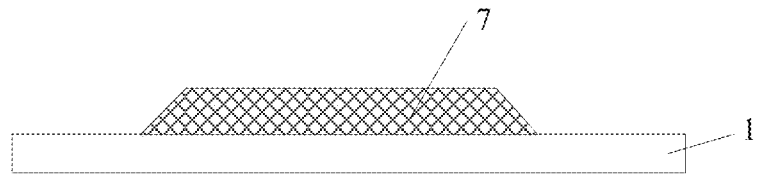
FIGS. 7A to 7H are cross-sectional views illustrating steps of the method of fabricating a thin film transistor according to an embodiment of the present disclosure.
Figure 7B:
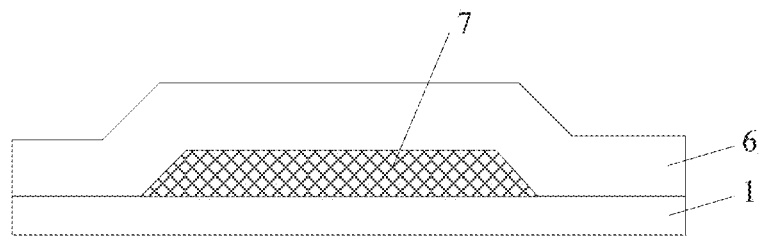

In this step, a gate material layer is deposited on the substrate 1 and patterned to obtain a pattern including the gate electrode 7, as illustrated in FIG. 7A. In addition, the gate insulating layer 6 is deposited on the gate electrode 7, as illustrated in FIG. 7B.

At step S20, an amorphous silicon layer is deposited.

Figure 7C:
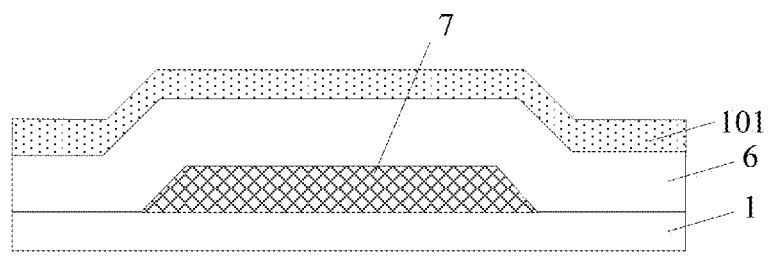

In this step, an amorphous silicon layer 101 is formed by a plasma enhanced chemical vapor deposition (PECVD) method, as illustrated in FIG. 7C.

At step S30, the amorphous silicon layer is subjected to a partial crystallization process, such that the amorphous silicon layer is crystallized into polysilicon in a region corresponding to the first portion of the active layer.

Figure 7D:
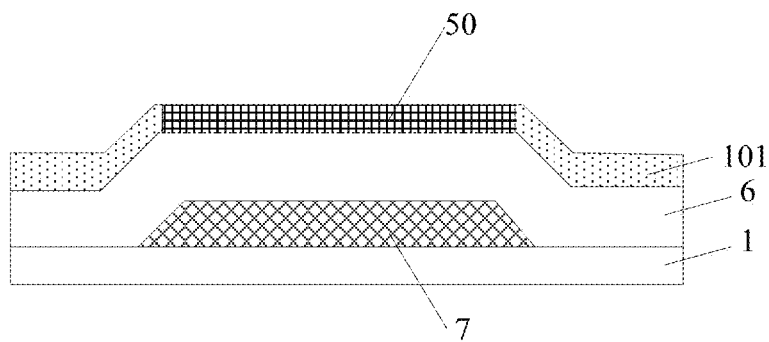

In this step, the amorphous silicon layer 101 is partially crystallized by using a laser crystallization technique with a mask, so that the amorphous silicon layer 101 is crystallized into polysilicon in an area corresponding to the first portion 50, while an area where the amorphous silicon layer 101 is not subject to the crystallization has amorphous silicon remained therein, thereby forming a pattern including the first portion 50, as illustrated in FIG. 7D.

In the fabrication process and referring to FIG. 4B, the amorphous silicon layer 101 may be partially crystallized by using an excimer laser annealing apparatus with the mask 10. In the excimer laser annealing apparatus, multiple groups of micro lenses 11 are superimposed, and laser with a high energy density is realized by multi-lens annealing (MLA). The portion irradiated with the light beam of the laser 12 is melted and recrystallized, so that the amorphous silicon in the region of the amorphous silicon layer 101 corresponding to the first portion 50 is selectively converted into polysilicon. In some embodiments, the mask is made of a special material such as an amorphous material (e.g., cadmium and the like) that does not absorb laser energy, to satisfy the requirement of temperature up to 1400° C.

At step S40, a patterning process is performed on the partially crystallized amorphous silicon layer to form a pattern including the active layer.

Figure 7E:
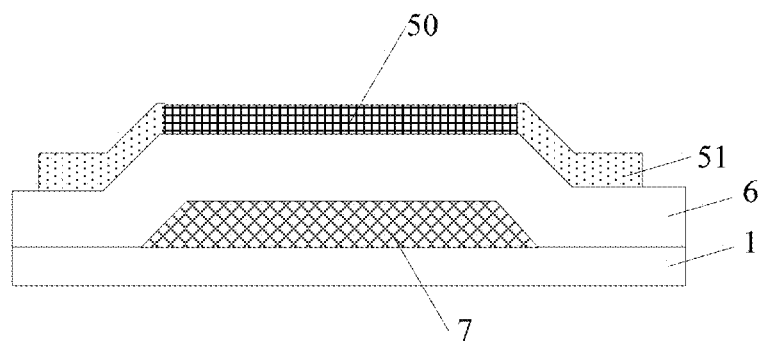

In this step, the amorphous silicon layer that is not subjected to the crystallization is patterned by a patterning process to obtain a pattern including the second portions 51, thereby forming a pattern including an active layer 5 (which includes the first portion 50 and the second portions 51), as illustrated in FIG. 7E. The first portion 50 of the active layer 5 is made of polysilicon, and the second portions 51 have the amorphous silicon remained therein. When the active layer 5 is in contact with the source and drain electrodes, the amorphous silicon of the second portions 51 can increase the contact resistances between the active layer and the source and drain electrodes.

In the method of fabricating a thin film transistor according to an embodiment of the present disclosure, by using a laser annealing apparatus with a mask instead of the existing excimer laser annealing apparatus, the amorphous silicon layer is partially crystallized to form the first portion 50 made of polysilicon, and the second portions 51 on which the source and drain electrodes will be subsequently formed have the original amorphous silicon remained therein. The amorphous silicon can effectively reduce the leakage current during the operation of the thin film transistor, thereby improving the display contrast of the display panel, and improving the final display effect. In addition, the method can also reduce the manufacturing cost and increase the productivity by omitting the LDD process in the existing LTPS backplane technique.

At step S50, a pattern including an ohmic contact layer is formed on the second portions of the active layer.

Figure 7F:
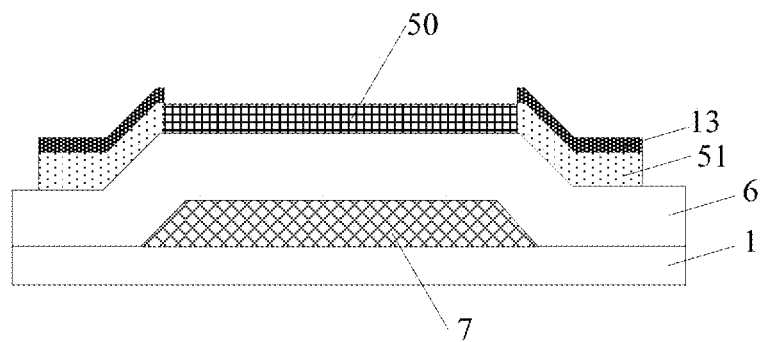

In order to reduce the difficulty of fabrication, in the fabricating method according to the embodiments of the present disclosure, the crystallization may be performed only on a portion of the amorphous silicon layer corresponding to the first portion 50 during the partial crystallization process, and the portions (i.e., the second portions 51) corresponding to the source electrode and the drain electrode have amorphous silicon remained therein, thereby omitting the process of doping the ohmic contact portions in the top gate transistor described with reference to FIG. 3H. In order to further reduce the leakage current, a layer of n+ amorphous silicon is deposited on the second portions 51 (i.e., the regions corresponding to the source electrode and the drain electrode), and an ohmic contact layer 13 is formed by a patterning process to reduce the contact resistances, as illustrated in FIG. 7F.

At step S60, a pattern including a source electrode and a drain electrode is formed on the ohmic contact layer.

Figure 7G:
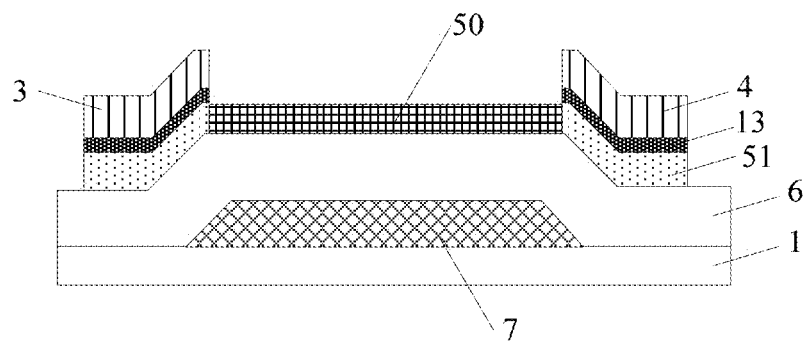
Figure 8A:
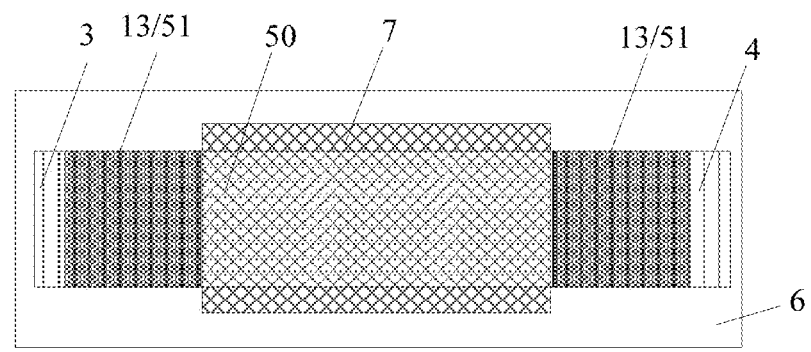
FIGS. 8A and 8B are top views illustrating a thin film transistor according to an embodiment of the present disclosure.

In this step, as illustrated in FIGS. 7G and 8A, a pattern including the source electrode 3 and the drain electrode 4 is formed on the ohmic contact layer 13 by a patterning process, to obtain a thin film transistor in which the leakage current can be reduced by the amorphous silicon.

Figure 7H:
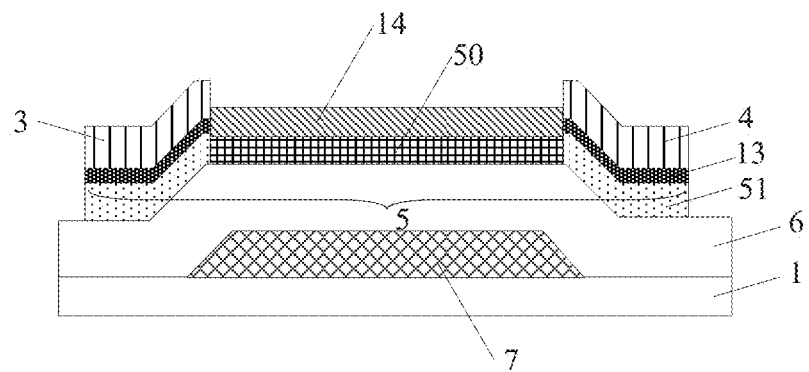
Figure 8B:
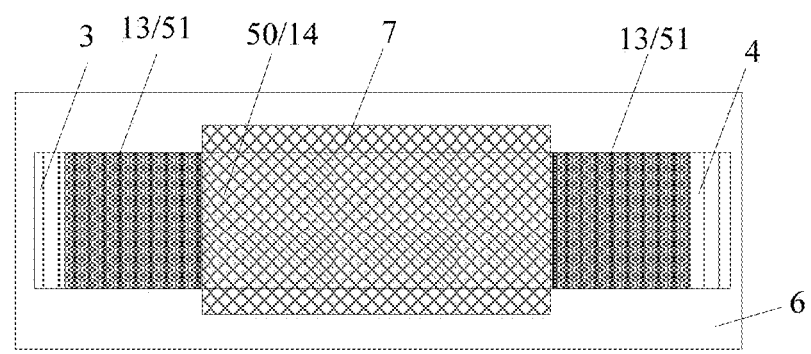

In the bottom-gate thin film transistor according to the embodiment of the present disclosure, the amorphous silicon structure for reducing the leakage current can be applied to a back channel etched (BCE) structure, the specific structure of which is illustrated in FIGS. 7G and 8A. It can also be applied to a structure of an etch stop layer (ESL) 14, the specific structure of which is illustrated in FIGS. 7H and 8B.

In the related art, a lightly doped drain region process is required in order to reduce the leakage current of the thin film transistor. Since the length of the lightly doped drain region is relatively difficult to control, and the doping amount of the lightly doped drain region also needs to be accurately controlled, the lightly doped drain region process is difficult and complicated. In the thin film transistor and the method of fabricating the same according to an embodiment of the present disclosure, a relatively low leakage current can be ensured without using a lightly doped drain region process, so a source electrode and a drain electrode can be doped without requiring the lightly doped drain region process, thereby effectively reducing the process difficulty.

In the thin film transistor and the method of fabricating the same according to an embodiment of the present disclosure, the amorphous silicon layer is partially crystallized by using a laser crystallization technique with a mask to obtain a first portion of the active layer made of polysilicon and ohmic contact portions made of polysilicon, while the uncrystallized regions still have amorphous silicon remained therein. These portions of the amorphous silicon layer keeps unetched, thereby omitting he lightly doped drain region process in the LTPS backplane fabrication, and the leakage current during the operation of the display panel can be reduced without the lightly doped drain region process. It can effectively reduce the difficulty in the fabrication, reduce the manufacturing cost, increase the productivity, and improve the characteristics of the product.

In the thin film transistor described with reference to FIGS. 1 to 4A, a doping process is performed before the patterning of the source electrode and the drain electrode, and the purpose of the doping process is to reduce the contact resistances between the ohmic contact layer and the source and drain electrodes. In the thin film transistor described with reference to FIGS. 5 to 8B, the method employed to reduce the contact resistances may be not limited to the doping process, and a layer of n+ amorphous silicon may be used as an etching buffer layer to reduce the contact resistances.

It should be understood that the above description of the thin film transistor according to the embodiments of the present disclosure is described by taking a single-gate thin film transistor as an example, but the present disclosure is not limited thereto. In practice, the inventive concept may be applied to dual-gate and multi-gate thin film transistor structures.

In another aspect, embodiments of the present disclosure provide an array substrate including a plurality of the above thin film transistors.

The array substrate can significantly reduce the leakage current of the LTPS panel, and improve the display effect of the panel while simplifying the fabrication process.

In another aspect, embodiments of the present disclosure provide a display device including the above array substrate.

The display apparatus may be any product or component with a function of display, such as a desktop computer, a tablet computer, a laptop computer, a mobile phone, a PDA, a GPS, an on-board display, a projection display, a video camera, a digital camera, an electronic watch, a calculator, an electronic instrument, a gauge, a liquid crystal panel, an electronic paper, a television, a monitor, a digital photo frame, a navigator, or the like, and can be applied to many fields such as public display and virtual display.

The display device has a better display effect.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present invention, and these variations and improvements shall also fall into the protection scope of the present disclosure.

What is claimed is:

1. A thin film transistor, comprising:
    an active layer comprising a first portion made of polysilicon and a second portion made of amorphous silicon;
    a source electrode and a drain electrode; and
    an ohmic contact layer,
    wherein the ohmic contact layer is in direct contact with the second portion of the active layer without directly contacting the first portion of the active layer, and the source electrode and the drain electrode are in contact with the ohmic contact layer,
    wherein the ohmic contact layer and the active layer are disposed in a same layer, and the ohmic contact layer is at two opposite sides of the active layer,
    the thin film transistor further comprises a gate electrode, and a gate insulating layer,
    wherein the ohmic contact layer and the active layer are on a substrate, the gate insulating layer is at a side of the ohmic contact layer and the active layer facing away from the substrate, and the gate electrode is at a side of the gate insulating layer facing away from the ohmic contact layer and the active layer, and
    the source electrode and the drain electrode are at a side of the ohmic contact layer facing away from the substrate, and are in contact with and electrically connected to the ohmic contact layer by passing through the gate insulating layer,
    wherein an orthographic projection of the gate electrode on the substrate covers orthographic projections of the first portion and the second portion of the active layer on the substrate, and
    wherein the orthographic projection of the gate electrode on the substrate is non-overlapping with an orthographic projection of the ohmic contact layer on the substrate.

2. The thin film transistor of claim 1, wherein the ohmic contact layer comprises polysilicon and an impurity for providing carriers.

3. The thin film transistor of claim 1, wherein the second portion of the active layer at least partially surrounds the first portion.

4. The thin film transistor of claim 1, further comprising a buffer layer on the substrate, wherein the ohmic contact layer and the active layer are at a side of the buffer layer facing away from the substrate.

5. A method of fabricating a thin film transistor, comprising:
    forming an active layer comprising a first portion made of polysilicon and a second portion made of amorphous silicon;
    forming an ohmic contact layer; and
    forming a source electrode and a drain electrode,
    wherein the active layer, the ohmic contact layer, and the source electrode and the drain electrode are formed such that the ohmic contact layer is in direct contact with the second portion of the active layer without directly contacting the first portion of the active layer, and the source electrode and the drain electrode are in contact with the ohmic contact layer, wherein the step of forming the active layer comprises:

forming an amorphous silicon layer; and performing a partial crystallization process on the amorphous silicon layer to form a polysilicon pattern and an amorphous silicon pattern, the polysilicon pattern comprising the first portion of the active layer and the amorphous silicon pattern comprising the second portion of the active layer, and wherein the polysilicon pattern comprises a first sub-portion and at least two second sub-portions, the second portion of the active layer being interposed between the first sub-portion and the second sub-portions, and the first sub-portion being the first portion of the active layer.

6. The method of claim 5, further performing a doping process on the second sub-portions of the polysilicon pattern to form the ohmic contact layer.

7. The method of claim 6, wherein the step of performing a doping process on the second sub-portions of the polysilicon pattern comprises:

forming an interlayer dielectric layer;

forming vias in the interlayer dielectric layer to expose the second sub-portions of the polysilicon pattern, respectively; and doping the second sub-portions of the polysilicon pattern through the via to form the ohmic contact layer.

8. The method of claim 5, wherein the step of performing the partial crystallization process on the amorphous silicon layer comprises:

performing the partial crystallization process on the amorphous silicon layer by using a laser crystallization technique with a mask.

9. The method of claim 8, wherein the partial crystallization process is performed on the amorphous silicon layer by using an excimer laser annealing apparatus with the mask, the excimer laser annealing apparatus comprising a plurality of groups of micro-lenses.

10. The method of claim 8, the mask is formed of a material not absorbing laser energy, the material not absorbing laser energy comprising cadmium.

11. An array substrate, comprising the thin film transistor of claim 1.

12. A display device, comprising the array substrate of claim 11.

13. The thin film transistor of claim 1, wherein a surface of the ohmic contact layer touches a surface of the second portion of the active layer.

* * * * *